(12) United States Patent
Singh et al.

(10) Patent No.: US 11,495,461 B2
(45) Date of Patent: Nov. 8, 2022

(54) FILM STACK FOR LITHOGRAPHY APPLICATIONS

(71) Applicant: Applied Materials, Inc., Santa Clara, CA (US)

(72) Inventors: Tejinder Singh, San Jose, CA (US); Suketu Arun Parikh, San Jose, CA (US); Daniel Lee Diehl, Chiba (JP); Michael Anthony Stolfi, Clifton Park, NY (US); Jothilingam Ramalingam, Milpitas, CA (US); Yong Cao, San Jose, CA (US); Lifan Yan, San Jose, CA (US); Chi-I Lang, Cupertino, CA (US); Hoyung David Hwang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 242 days.

(21) Appl. No.: 16/800,351

(22) Filed: Feb. 25, 2020

(65) Prior Publication Data
US 2020/0273705 A1    Aug. 27, 2020

Related U.S. Application Data

(60) Provisional application No. 62/810,133, filed on Feb. 25, 2019.

(51) Int. Cl.
*H01L 21/033* (2006.01)
*H01L 21/311* (2006.01)

(52) U.S. Cl.
CPC ...... *H01L 21/0337* (2013.01); *H01L 21/0332* (2013.01); *H01L 21/31116* (2013.01); *H01L 21/31122* (2013.01)

(58) Field of Classification Search
None
See application file for complete search history.

(56) References Cited

U.S. PATENT DOCUMENTS

| 6,610,447 | B2 | 8/2003 | Yan et al. |
| 7,888,267 | B2 | 2/2011 | Ko et al. |
| (Continued) | | | |

FOREIGN PATENT DOCUMENTS

KR    10-1569938 B1    11/2015

OTHER PUBLICATIONS

International Search Report and Written Opinion dated May 20, 2020 for Application No. PCT/US2020/015182.

(Continued)

*Primary Examiner* — Roberts P Culbert
(74) *Attorney, Agent, or Firm* — Patterson + Sheridan, LLP

(57) ABSTRACT

Methods for forming a film stack comprising a hardmask layer and etching such hardmask layer to form features in the film stack are provided. The methods described herein facilitate profile and dimension control of features through a proper profile management scheme formed in the film stack. In one or more embodiments, a method for etching a hardmask layer includes forming a hardmask layer on a substrate, where the hardmask layer contains a metal-containing material containing a metal element having an atomic number greater than 28, supplying an etching gas mixture to the substrate, and etching the hardmask layer exposed by a photoresist layer.

20 Claims, 6 Drawing Sheets

(56) References Cited

U.S. PATENT DOCUMENTS

| | | | |
|---|---|---|---|
| 9,570,301 | B2 | 2/2017 | Tsai et al. |
| 9,996,004 | B2 | 6/2018 | Smith et al. |
| 10,395,925 | B2 | 8/2019 | De Silva et al. |
| 2005/0118531 | A1 | 6/2005 | Lee et al. |
| 2007/0010099 | A1 | 1/2007 | Du et al. |
| 2009/0194503 | A1 | 8/2009 | Ko et al. |
| 2011/0303639 | A1* | 12/2011 | Ng .................... H01L 21/32136 216/41 |
| 2014/0212819 | A1 | 7/2014 | Wuister et al. |
| 2014/0356770 | A1* | 12/2014 | Hayashi .................... G03F 1/24 430/5 |
| 2018/0025914 | A1* | 1/2018 | Zhou ................. H01L 21/32137 438/695 |
| 2018/0203355 | A1 | 7/2018 | De Silva et al. |

OTHER PUBLICATIONS

International Search Report and Written Opinion dated Jun. 18, 2020 for Application No. PCT/US2020/019696.

\* cited by examiner

FILM STACK FOR LITHOGRAPHY APPLICATIONS

CROSS-REFERENCE TO RELATED APPLICATIONS

This application claims benefit of U.S. Appl. No. 62/810,133, filed Feb. 25, 2019, which is incorporated by reference in its entirety.

BACKGROUND

Field

The embodiments herein generally relate to a film stack and an etching process for etching such film stack with high selectivity and good profile control to EUV lithography exposure and patterning process.

Description of the Related Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing a film stack and an etch processes that are capable of reliably forming features with such high aspect ratios presents a significant challenge. However, inaccurate control or low resolution of the lithography exposure and developing process may cause in poor critical dimension of a photoresist layer utilized to transfer features in a film stack, resulting in unacceptable line width roughness (LWR). Large line width roughness (LWR) and undesired wiggling profile of the photoresist layer resulted from the lithography exposure and developing process may cause inaccurate feature transfer to the film stack, thus, eventually leading to device failure and yield loss.

Furthermore, during etching of such film stack, redeposition or build-up of by-products or other materials generated during the etching process may accumulate on the top and/or sidewalls of the features being etched, thus undesirably blocking the opening of the feature being formed in the material layer. Different materials selected for the film stack may result in different amounts or profiles of the by-products redeposited in the film stack. Furthermore, as the opening of the etched features are narrowed and/or sealed by the accumulated redeposition of material, the reactive etchants are prevented from reaching the lower surface of the features, thus limiting the aspect ratio that may be obtained. Additionally, as the redeposition material or build-up of by-products may randomly and/or irregularly adhere to the top surface and/or sidewalls of the features being etched, the resulting irregular profile and growth of the redeposition material may alter the flow path of the reactive etchants, thus resulting in bowing or twisting profiles of the features formed in the material layer. In accurate profile or structural dimensions may result in collapse of the device structure, eventually leading to device failure and low product yield. Poor etching selectivity to the materials included in the film stack may undesirably result in an inaccurate profile control, thus eventually leading to device failure.

Therefore, there is a need in the art for a proper film stack and an etching method for etching features with desired profile and small dimensions in such film stack.

SUMMARY

Methods for forming a film stack and etching the same to form high aspect ratio features in the film stack are provided. The methods described herein facilitate profile and dimension control of features with high aspect ratios through a proper sidewall and bottom management scheme with desired materials selected for the film stack. In one or more embodiments, a method for etching a hardmask layer includes forming a hardmask layer on a substrate, where the hardmask layer includes a metal-containing material containing a metal element having an atomic number greater than 28, supplying an etching gas mixture to the substrate, and etching the hardmask layer exposed by a photoresist layer.

In other embodiments, a method for etching a hardmask layer includes forming a passivation layer on a surface of a photoresist layer disposed on a hardmask layer, where the hardmask layer contains at least one of tin oxide, tin silicon oxide, tantalum oxide, indium tin oxide, and indium gallium zinc oxide, and etching the hardmask layer exposed by the photoresist layer, where the hardmask layer is etched by a gas mixture having a chlorine-containing gas or a bromine-containing gas.

In some embodiments, a method for etching a hardmask layer includes etching a hardmask layer exposed by a photoresist layer, where the hardmask layer is etched by a gas mixture having a chlorine-containing gas or a bromine-containing gas, wherein the hardmask layer comprises at least two layers having different absorption coefficients.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

Figure 1:
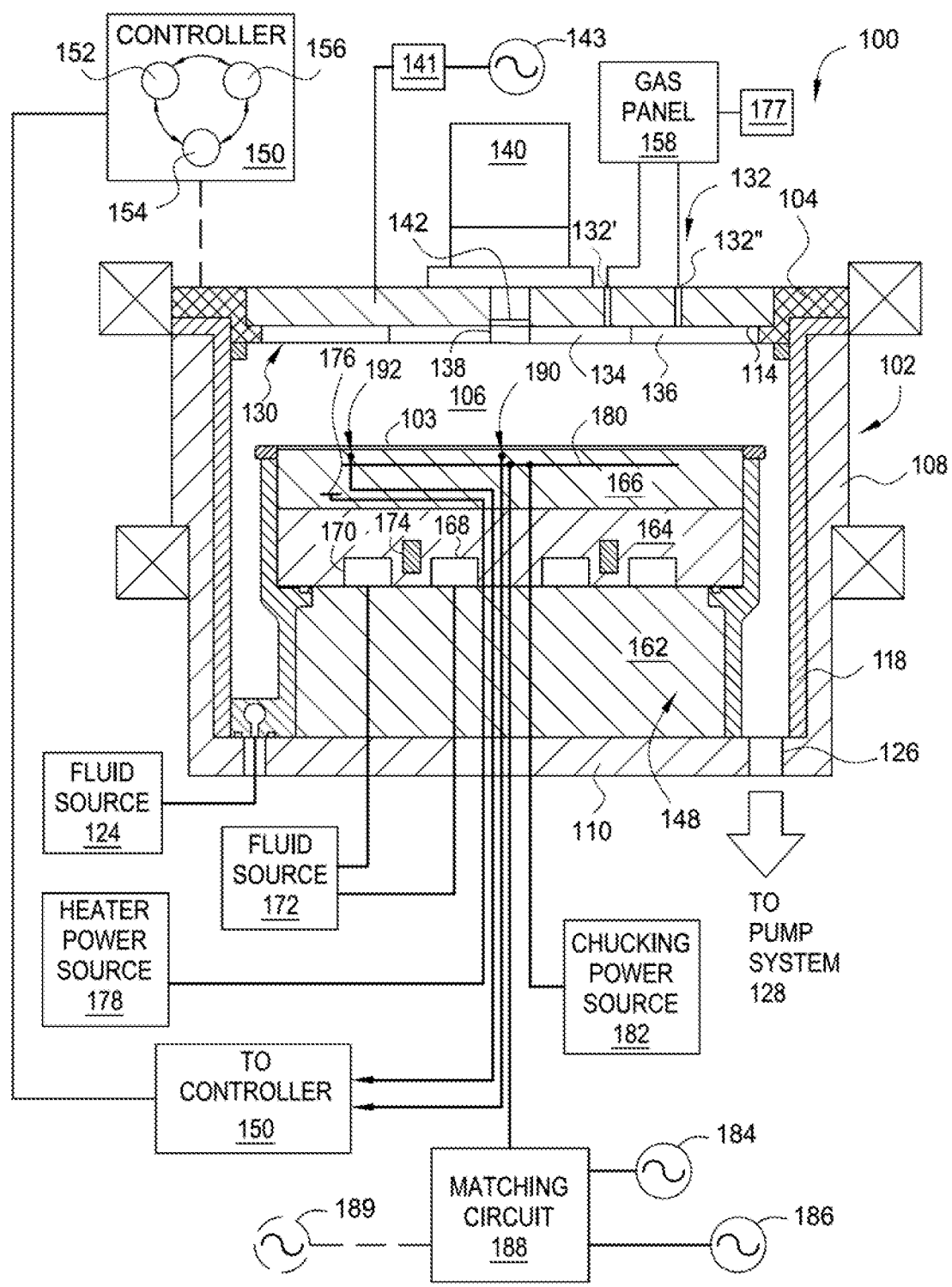
FIG. 1 depicts a processing chamber that may be utilized to form a dielectric layer, according to one or more embodiments.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Embodiments for the present application includes methods for forming a film stack and an etching process to etch such film stack to form features having desired aspect ratios and profiles in the film stack. The film stack includes a hardmask layer having a metal-containing material in the film stack. The hardmask layer may be a single layer or multiple layers with selected film properties to assist etching resistance and enhance lithography exposure performance as needed. In one or more embodiments, the hardmask layer is a metal-containing material with desired absorption coefficient or mixture of different values of absorption coefficient so as to assist the exposure and developing accuracy during the lithography exposure process. An etching process with desired chemistry is also selected to pattern the film stack, particularly to etch the hardmask layer.

FIG. 1 is a sectional view of one example of a processing chamber 100 suitable for performing a patterning process to etch a film stack having a hardmask layer fabricated from a metal-containing material. Suitable processing chambers that may be adapted for use with the teachings disclosed herein include, for example, an ENABLER® or C3® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one or more implementations, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one or more embodiments, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon containing gas, an oxygen gas, a nitrogen containing gas and a chlorine-containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$, and the like. Examples of the oxygen-containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine-containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. An RF source power 143 is coupled through a matching network 141 to the showerhead assembly 130. The RF source power 143 typically is capable of producing up to about 3,000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one or more embodiments, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the electrostatic chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias sources 184, 186. The RF bias power sources 184, 286 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of about 50 kHz to about 200 MHz and a power of about 0 watts and about 8,000 watts, such as about 1 watt and about 5,000 watts. An additional bias power source 189 may be coupled to the electrode 180 to control the characteristics of the plasma.

During operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
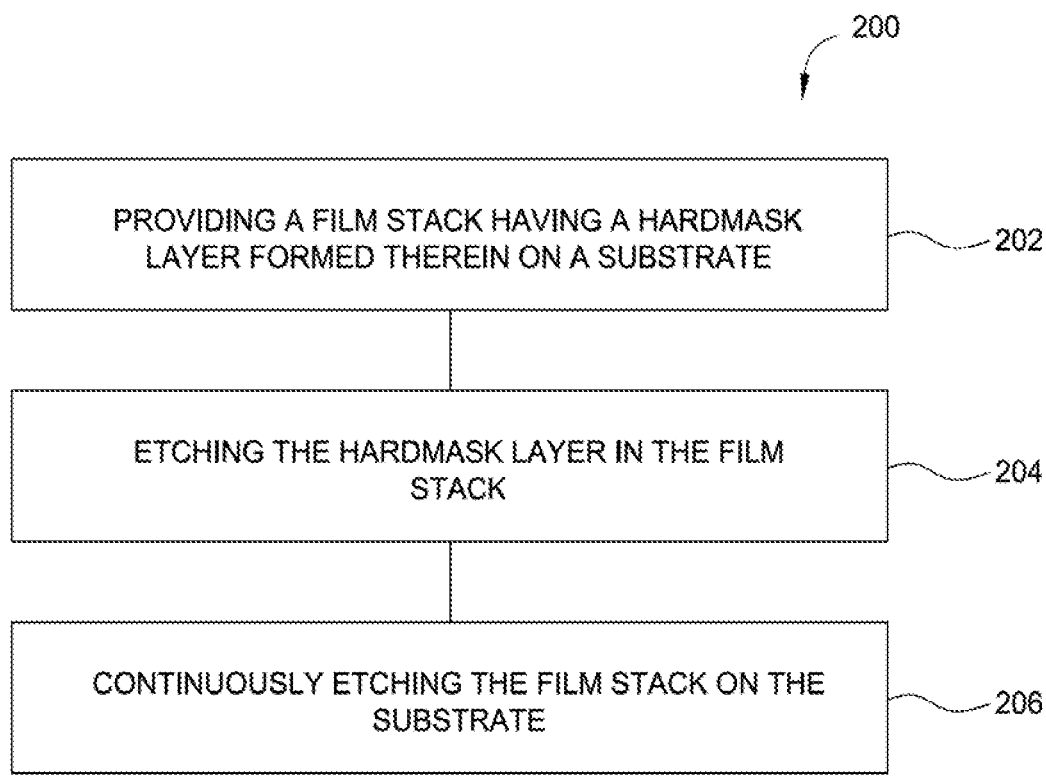
FIG. 2 depicts a flow diagram for performing a spacer layer patterning process, according to one or more embodiments.

FIG. 2 illustrates a flow diagram of a method 200 for etching a film stack 302 having a hardmask layer 310 formed from a metal-containing material. FIGS. 3A-3D are cross-sectional views of a portion of a substrate 300 with corresponding to various stages of the method 200. The method 200 may be utilized to form features with desired critical dimensions and profiles, such as a contact structure, gate structure, NAND structure or interconnection structure for logic or memory devices as needed. Alternatively, the method 200 may be beneficially utilized to etch other types of structures.

In one or more examples, the film stack 302 has a photoresist layer 312 disposed thereon. The photoresist layer 312 may be a positive-tone photoresist and/or a negative-tone photoresist that are capable of undergoing a chemically amplified reaction. The photoresist layer 312 is a polymer organic material suitable for an EUV lithography process. In one or more examples, the photoresist layer 312 comprises at least one metal element selected from at least one of Sn, Ta, In, Ga, Zr, Zn, any alloy thereof, or any combination thereof. The metal element included in the photoresist layer 312 may alter the light absorption efficiency during a lithographic exposure process as needed.

Figure 4A:
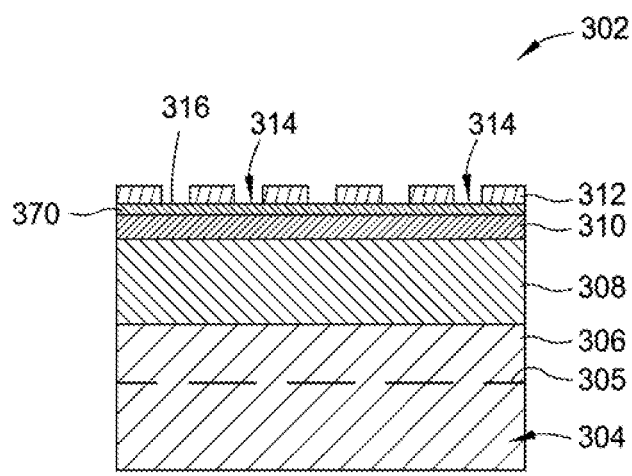
FIGS. 4A-4B depict different embodiments of the film stack formed on a substrate that may have features formed therein utilizing the process depicted in FIG. 2.

The photoresist layer 312 is disposed on the hardmask layer 310, which further disposed on a bottom anti-reflective coating (BARC) layer 308. An optional organic layer 370, as shown in FIG. 4A, may be formed between the photoresist layer 312 and the bottom anti-reflective coating layer 308 as needed. The optional organic layer 370 includes an organic material or a mixture of organic or inorganic materials. In the embodiment wherein the optional organic layer 370 is an organic material, the organic material may be a cross-linkable polymeric material that may be coated onto the substrate 300 through a spin-on process, and then thermally cured so that the photoresist layer 312 may be applied thereon. In the embodiment wherein the optional organic layer 370 is a mixture of organic or inorganic materials, the optional organic layer 370 may be a dielectric material formed by any suitable deposition techniques, such as chemical vapor deposition (CVD), atomic layer deposition (ALD), physical vapor deposition (PVD), spin-on-coating, spray coating, or the like.

The optional organic layer 370 functions as a planarizing layer, an antireflective coat and/or photoacid direction controller, which may provide etch resistance and line edge roughness control when transferring the pattern into the underlying hardmask layer 310 and the layers thereunder. The patterning resistant functionality from the optional organic layer 370 may work with the underlying hardmask layer 310 during the transfer of the resist process. In one or more examples, the optional organic layer 370 does not interact with the photoresist layer 312 and does not have interfacial mixing and/or diffusion or cross contamination with the photoresist layer 312.

The BARC layer 308 is disposed on a dielectric multi-layer 305 on the substrate 300. A target layer (not shown) may be formed between the dielectric multi-layer 305 and the substrate 300 as needed. The photoresist layer 312 defines openings 314 that expose a surface 316 of the hardmask layer 310 for etching.

The substrate 300 may be any one of semiconductor substrates, silicon wafers, glass substrates and the like. The substrate 300 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 300 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter.

The hardmask layer 310 as selected to be formed in the film stack 302 is a metal-containing material. The hardmask layer 310 may include a single layer or a multiple layers. In the example depicted in FIG. 3A, the hardmask layer 310 is a single layer containing or formed from the metal-containing material, such as a metal dielectric layer, containing a metal element having an atomic number greater than 28, such as 29-32, 37-51, and 55-83. The metal-containing material can include one or more metal elements selected from tin (Sn), tantalum (Ta), indium (In), gallium (Ga), zinc (Zn), zirconium (Zr), aluminum (Al), or combinations thereof. Suitable examples of the metal-containing materials for the hardmask layer 310 can be or include tin oxide (SnO), tin silicon oxide (SnSiO), tantalum oxide (TaO), indium tin oxide (InSnO), indium gallium zinc oxide (IGZO), one or more alloys thereof, one or more dopants thereof, or any combination thereof.

The metal-containing material as selected for the hardmask layer 310 may affect the reflection and/or absorption efficiency of the EUV light during the lithography exposure process. Thus, by proper selection of the materials for the hardmask layer 310, the performance of lithography exposure process may be enhanced, such as high lithography resolution, defect reduction, photoresist layer profile control, energy dose reduction, and/or line edge roughness reduction. In one or more examples, the metal-containing material selected for the hardmask layer 310 may have relatively high absorption coefficient under EUV light having a wavelength of about 13.5 nm. It is believed that higher density (or greater concentration value) of the metal elements in the metal-containing material for the hardmask layer 310 provides a film property with higher absorption. Furthermore, dopants of silicon and/or oxygen elements in the metal-containing material for the hardmask layer 310 also assists reducing agglomeration during the lithographic exposure process, thus reducing likelihood of defect generation. Thus, by proper selection of the ratio between the metal element and the oxygen and/or silicon elements in the metal-containing material for the hardmask layer 310, a desired amount of the secondary electrons in the metal-containing material for the hardmask layer 310 may be obtained. For example, it is believed that a relatively lower concentration of oxygen and/or silicon in the metal containing layer may improve secondary electron generation, which may enhance high absorption. Thus, a ratio of metal elements to silicon or oxygen elements (metal:Si/O) may be controlled between about 80:1/19 and about 90:1/9 to provide the desired absorption during the lithographic exposure process. It is noted that the lower concentration of oxygen and/or silicon in the metal-containing material (e.g., greater concentration of the metal element in the metal-containing material) provides higher film conductivity and low film resistivity, thus also enhancing metal density, which provides higher absorption efficiency. In one or more examples, the metal containing layer for the hardmask layer 310 has a thickness between about 10 Å and about 500 Å, such as between about 20 Å and about 200 Å, for example between about 50 Å and about 100 Å.

In one or more examples, selection of the metal elements in the metal-containing material for the hardmask layer 310 having a relatively larger atomic number (e.g., atomic number greater than 28) may also provide relatively high absorption efficiency during the lithographic exposure process. The metal-containing material for the hardmask layer 310 may have a EUV photoabsorption cross section greater than $1 \times 10^5$ (cm$^2$/mol) under an EUV light range of about 5 nm and about 20 nm.

In the embodiment wherein the hardmask layer 310 is a single layer, the metal-containing material selected to form the hardmask layer 310 may include a metal element having an atomic number greater than 28, and in some examples, greater than 35. In one or more examples, the metal element can have an atomic number selected from 29-32, 37-51, and 55-83. Exemplary metal elements can be tin (Sn), tantalum (Ta), indium (In), gallium (Ga), zirconium (Zr), zinc (Zn), or any combination thereof.

Figure 4B:
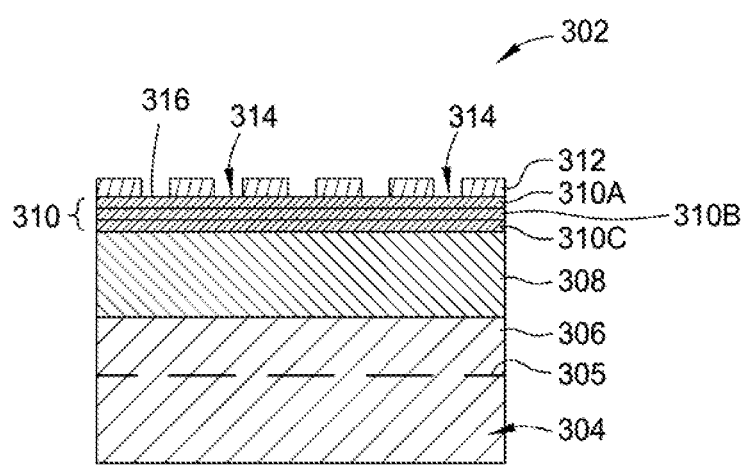

In the embodiment wherein the hardmask layer 310 includes one or more layers, such as bilayers or multiple layers, as shown in FIG. 4B, the hardmask layer 310 may have multiple layers, such as a first layer 310A, a second layer 310B and a third layer 310C formed from different metal-containing materials. Selection of the materials for the first layer 310A, the second layer 310B and the third layer 310C is based on different absorption coefficients of the metal-containing materials. For example, the first, second, and third layers 310A, 310B, 310C may each have different high to low, low to high, or alternating high and low absorption coefficients sequentially formed in the hardmask layer 310 so as to enhance reflection of the EUV light during the lithography exposure process. In one or more examples, the first, second, and third layers 310A, 310B, 310C may have a high and low alternating absorption coefficients by selecting different types of the metal elements in the metal containing layer for the first, second, and third layers 310A, 310B, 310C. For example, the metal elements selected for at least one of the first, second, and third layers 310A, 310B, 310C may have atomic numbers greater than 28, such as greater than 35 and at least one of the first, second, and third layers 310A, 3106, 310C less than 28. The metal element selected to form the second layer 3106 of the hardmask layer 310 may have a smaller (or larger) atomic number than the nearby neighboring metal elements formed in the first and the third layers 310A, 310C. For example, the hardmask layer 310 can include the first layer 310A containing a first metal element, the second layer 310B containing a second metal element, and the third layer 310C containing a third metal element. In some examples, the second metal element in the second layer 310B has an atomic number different than (e.g. greater than or less than) the first metal element in the first layer 310A and/or the third metal element in the third layer 310C.

In the embodiment wherein a bilayer structure is utilized for the hardmask layer 310, such bilayer structure may have a first portion (e.g., an upper portion or layer) containing a metal element having an atomic number greater than 28, such as 29-32, 37-51, and 55-83, and a second portion (e.g., a lower portion or layer) containing an element having an atomic number of less than 28, such as 3-8, 11-16, and 19-27. Furthermore, instead of forming the hardmask layer 310 as multiple layers or more than one layers, the hardmask layer 310 may be formed as a gradient having different ratio of the metal elements to the silicon and/or oxygen elements formed in the hardmask layer 310 as needed to provide different absorption coefficients along the bulk film body of the hardmask layer 310. For example, the metal element concentration of the hardmask layer 310 may be gradually increased or decreased with the thickness increase of the hardmask layer 310 formed on the substrate 300 as needed. Alternatively, each layer of the bilayer structure or the multiple layers of the hardmask layer 310 may also be a gradient layer. For example, in the bilayer structure of the hardmask layer 310, the upper portion of the hardmask layer 310 may have a low resistivity with relatively high metal element concentration or even pure metal layer (e.g., such as a metallic Sn layer as an example) while the lower portion of the hardmask layer 310 may have a high concentration of silicon and/or oxygen, as needed.

Although the embodiment depicted in FIG. 4B only shows multiple layers as three layers, it is noted that the hardmask layer 310 may have multiple layers, as many as needed.

The hardmask layer 310 may be formed by any suitable deposition techniques as needed. In one or more examples, the hardmask layer 310 is formed by CVD, ALD, PVD, spin-on-coating, spray coating process or other suitable deposition processes.

In the example wherein the hardmask layer 310 is formed by a CVD or PVD process, a carrier gas and/or an inert gas with relatively higher atomic weight, such as Xe or Kr, may be used during the plasma deposition process of the hardmask layer 310. The substrate temperature controlled during the formation of the hardmask layer 310 may be controlled between −50° C. and about 250° C. It is believed that a relatively low substrate temperature control, e.g., less than 250° C., while forming the hardmask layer 310 may assist forming the hardmask layer 310 at a relatively slow deposition rate, rendering a film surface with a relatively smooth surface.

Furthermore, as discussed above, after the hardmask layer 310 formed on the BARC layer 308, the optional organic layer 370 may be optionally formed on the hardmask layer 310, as shown in FIG. 4A. In the embodiment wherein the optional organic layer 370 is present, the optional organic layer 370 may assist further treating the surface of the hardmask layer 310 to provide a relatively robust surface structure as needed. Alternatively, the surface of the hardmask layer 310 may be treated right after the hardmask layer 310 is formed. It is noted that the optional organic layer 370 may be a carbon based material or polymer material formed from a silicon or carbon containing precursor, such as trimethylsilane (TMS), $CH_4$, or other carbon and hydrogen containing gases as needed.

Under the hardmask layer 310, the BARC layer 308 is disposed on the dielectric multi-layer 305. The BARC layer 308 and the hardmask layer 310 may be in combination serves as an etch mask to etch features in the BARC layer 308 for patterning the underlying dielectric multi-layer 305 with desired aspect ratios and profiles. The features described herein may include trenches, vias, openings and the like. In one or more embodiments, the BARC layer 308 may be a material which can be or include silicon, silicon oxide, silicon nitride, silicon oxynitride, silicon carbide, amorphous carbon, doped amorphous carbon, carbon containing materials, or any combination thereof. In some exemplary embodiments depicted herein, the BARC layer 308 is an amorphous carbon layer. One example of the amorphous carbon layer may be an Advanced Patterning Film™ (APF) available from Applied Materials, Inc.

The dielectric multi-layer 305 may be in form of a single layer or multiple layers as needed. In examples depicted in FIGS. 3A-3D, the dielectric multi-layer 305 includes a metal dielectric layer 304 disposed between a first dielectric layer 306 and a second dielectric layer 303. The first and the second dielectric layers 306, 303 may be a silicon containing material selected from SiON, SiN, $SiO_2$, Si, or composite layers including SiON or SiN, or $SiO_2$, or any suitable materials as needed. The metal dielectric layer 304 may be at least one of TaN, TiN, TaON, TaO, TiON, TiO or the like as needed. The target material (not shown) disposed between the dielectric multi-layer 305 and the substrate 300 may be a dielectric material. Suitable exemplary materials for the dielectric layer include undoped silicon glass (USG), such as silicon oxide or TEOS, boron-silicate glass (BSG), phosphorus-silicate glass (PSG), boron-phosphorus-silicate glass (BPSG), high-k material, low dielectric constant insulating materials (e.g., dielectric constants less than about 4.0) and combinations thereof. Examples of low dielectric constant insulating materials include silicate glass, fluorosilicate glass (FSG), and carbon doped silicon oxide (SiOC), silicon carbide (SiC) and nitrogen-containing silicon carbide (SiCN), among others.

In one or more embodiments depicted herein, the target layer is an undoped silicon glass (USG) layer. The first and the second dielectric layers 306, 303 are silicon oxide and silicon nitride respectively. The BARC layer 308 is an amorphous carbon layer. The hardmask layer 310 is a SnO or SnSiO layer.

The method 200 begins at operation 202 by transferring or providing the substrate 300 to an etch process chamber, such as the processing chamber 100 depicted in FIG. 1.

Figure 3A:
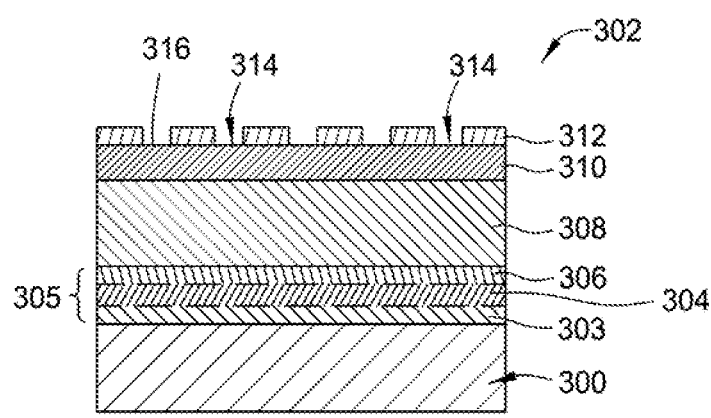
FIGS. 3A-3D depict a film stack at various stages during an etching process to etch a dielectric layer in a substrate utilizing the process depicted in FIG. 2, according to one or more embodiments.
Figure 3B:
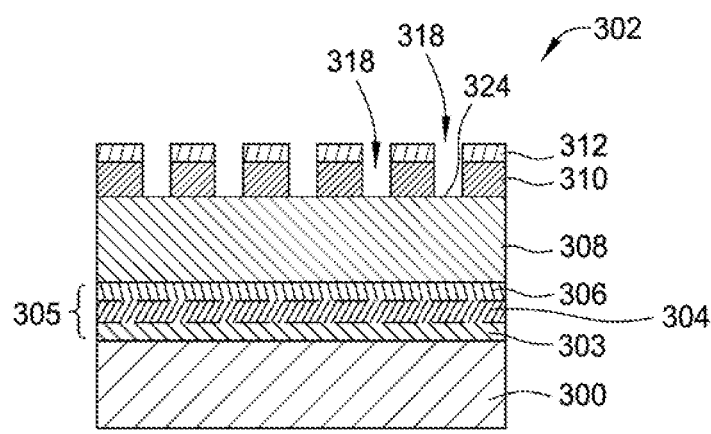

At operation 204, an etching process is performed to etch the hardmask layer 310, as shown in FIG. 3B, until a surface 324 of the underlying BARC layer 308 is exposed. During etching, a selected gas mixture is supplied into the processing chamber 100 to etch the hardmask layer 310 to form features 318 in the hardmask layer 310. As the dimensions of the openings 314 defined by the photoresist layer 312 is maintaining small (e.g., less than 100 nm), a gas mixture as well as process parameters for etching the hardmask layer 310 requires to be carefully selected so as to etching the hardmask layer 310 with good profile control without damaging the underlying BARC layer 308.

In one or more examples, the etching process is performed by supplying an etching gas mixture into the processing chamber while maintaining a temperature of the substrate support pedestal assembly 148 between room temperature (e.g., about 23° C.) and up to about 150° C.

In some examples, the etching gas mixture includes at least one halogen-containing. Halogen-containing gas may include a fluorine containing gas, a chlorine-containing gas, or a bromide containing gas. Suitable examples of the halogen-containing gas include $SF_6$, $SiCl_4$, $Si_2Cl_6$, $NF_3$, HBr, $Br_2$, $CHF_3$, $CH_2F_2$, $CF_4$, $C_2F$, $C_4F_6$, $C_3F_8$, HCl, $C_4F_8$, $Cl_2$, HF, $CCl_4$, $CHCl_3$, $CH_2Cl_2$, and $CH_3Cl$. In some examples, silicon containing gas may also be supplied in the etching gas mixture. Suitable examples of the silicon containing gas include $SiCl_4$, $Si_2Cl_6$, $SiH_4$, $Si_2H_6$, and the like. Furthermore, particularly, examples of the chlorine-containing gas include HCl, $Cl_2$, $CCl_4$, $CHCl_3$, $CH_2Cl_2$, $CH_3Cl$, $SiCl_4$, $Si_2Cl_6$, and the like, and examples of the bromide containing gas include HBr, $Br_2$, and the like. A reacting gas, such as an oxygen-containing gas or a nitrogen-containing gas, for example, $O_2$, $N_2$, $N_2O$, $NO_2$, $O_3$, $H_2O$, or the like may also be supplied in the etching gas mixture as needed.

In one or more examples, the halogen-containing gas used to etch the hardmask layer comprises a chlorine-containing gas or a bromide containing gas. While supplying the etching gas mixture into the processing chamber, an inert gas may be optionally supplied into the etching gas mixture to assist the profile control as needed. Examples of the inert gas supplied in the gas mixture include Ar, He, Ne, Kr, Xe, or the like.

In one particular example, the etching gas mixture utilized to etch the hardmask layer 310, such as a metal-containing material (e.g., a Sn/SnO/SnSiO layer), includes HBr, $Cl_2$, Ar, He, or combinations thereof.

During etching, the chamber pressure of the etching gas mixture is also regulated. In one or more embodiments, a process pressure in the plasma processing chamber is regulated between about 2 mTorr to about 100 mTorr, for example, at about 3 mTorr and 20 Torr, such as about 6 mTorr. RF source or bias power may be applied to maintain a plasma formed from a continuous mode or a pulsed mode as needed in presence of the etching gas mixture. For example, a RF source power with a frequency of about 13.56 MHz may be applied at an energy level of between about 200 watts to about 1,000 watts, such as about 500 watts, to an inductively coupled antenna source to maintain a plasma inside the etch chamber. In addition, a RF bias power, with a frequency of between about 2 MHz and about 13.56 MHz, may be applied less than 500 watts, such as between about 0 watts to about 450 watts, such as about 150 watts.

In one or more examples, the RF bias power and the RF source power may be pulsed in the processing chamber 100 during the etching at operation 204. The RF bias power and the RF source power may be synchronized or non-synchronized pulsed into the processing chamber. In some examples, the RF bias power and the RF source power are non-synchronized pulsed into the processing chamber. For example, the RF source power may be pulsed to the processing chamber prior to pulsing the RF bias power. For example, the RF bias power may be in pulse mode synchronized with the RF source power or with a time delay with respect to the RF source power. In one or more examples, the RF source power and the RF bias power are pulsed between about 5% and about 75% of each duty cycle. Each duty cycle, for example between each time unit is between about 0.1 millisecond (ms) and about 10 ms.

In one example of the etching gas mixture supplied at operation 204, the $O_2$ gas may be supplied into the chamber at a rate between about 0 sccm to about 50 sccm. The halogen-containing gas, such as HBr, may be supplied at a flow rate between about 25 sccm and about 250 sccm, such as about 100 sccm.

Figure 3C:
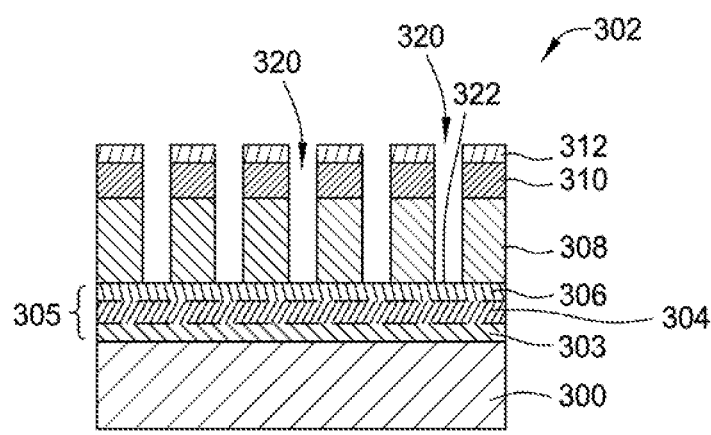

At operation 206, after the hardmask layer 310 is etched, exposing the surface 324 of the BARC layer 308, a second etching process is further performed to remove a portion of the BARC layer 308 from the exposed surface 324, as shown in FIG. 3C, until a surface 322 of the dielectric multi-layer 305 is exposed. The etching gas mixture may be the same from the etching gas mixture supplied at operation 204. Alternatively, the etching gas mixture utilized to etch the BARC layer 308 may be different from the etching gas mixture utilized to etch the hardmask layer 310 at operation 204. In one or more examples, the etching gas mixture utilized to etch the BARC layer 308 may include a chlorine-containing gas, such as HCl or $Cl_2$ gas.

Figure 3D:
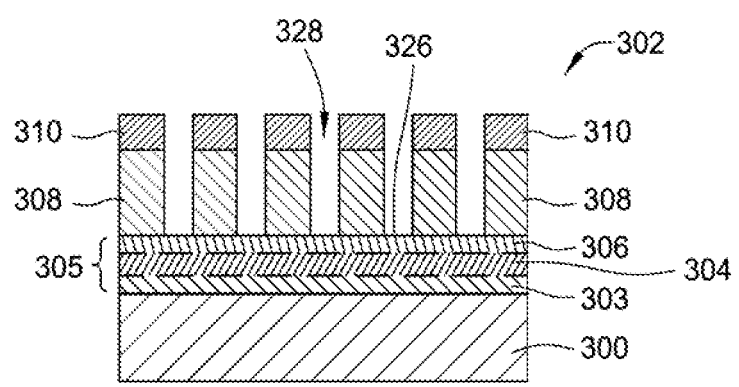

After the features 328 are formed in the BARC layer 308, a de-scum or a strip process may be performed to remove the remaining photoresist layer 312, if any, from the substrate, as shown in FIG. 3D. It is noted that further etching process or patterning process may be performed to continue transferring features 328 into the dielectric multi-layer 305 and/or the target layer (not shown) thereon as needed.

Figure 5:
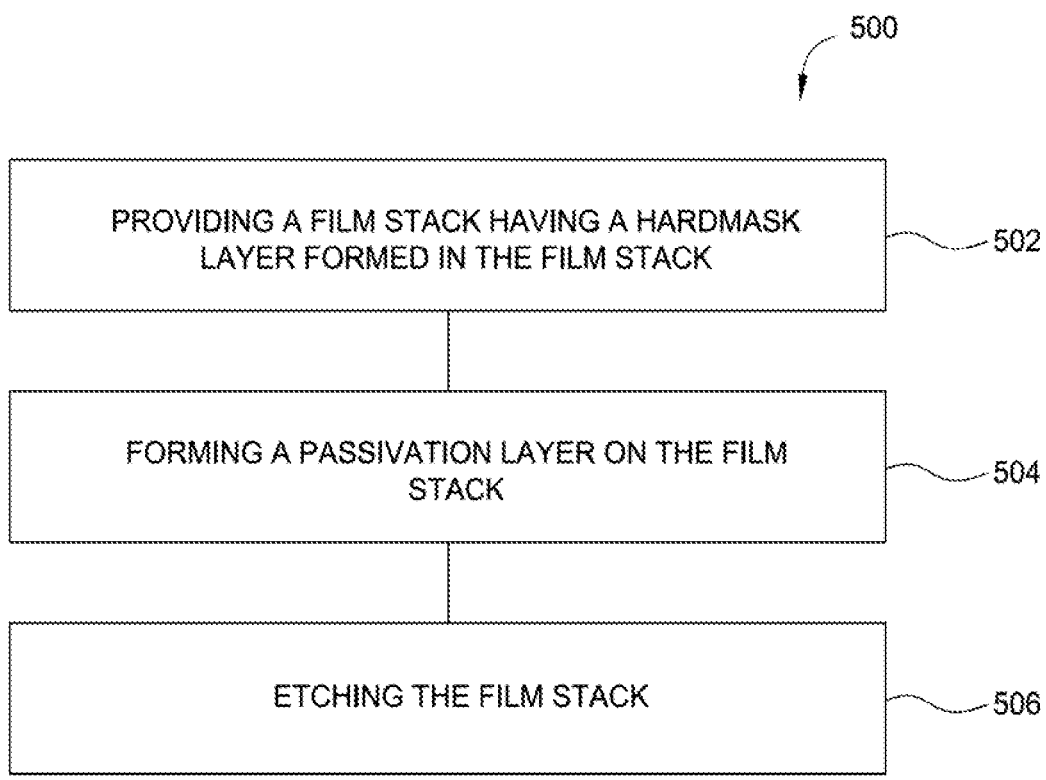
FIG. 5 depicts a flow diagram of another method for performing a spacer layer patterning process, according to one or more embodiments.

FIG. 5 illustrates another example of a flow diagram of a method 500 for etching a film stack, such as the film stack 302 discussed above, having the hardmask layer 310 formed from a metal-containing material. FIGS. 6A-6D are cross-sectional views of a portion of the substrate 300 with corresponding to various stages of the method 500. Similarly, as discussed above, the film stack 302 has the photoresist layer 312 disposed thereon. The hardmask layer 310 is disposed on the BARC layer 308 with the dielectric multi-layer 305 formed on the substrate 300. Similarly, the optional organic layer 370, as shown in FIG. 4A, or multiple layers of the hardmask layer 310, as shown in FIG. 4B, may also be utilized to be etched using the method 500 depicted in FIG. 5.

The method 500 begins at operation 502 by transferring or providing the substrate 300 to a processing chamber, such as a deposition chamber or an etching chamber as needed.

Figure 6A:
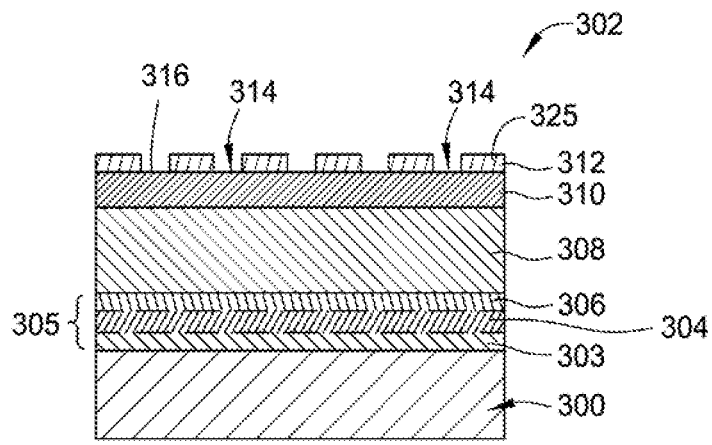
FIGS. 6A-6D depict exemplary schematics of another film stack at various stages during an etching process to etch a dielectric layer in a substrate utilizing the process depicted in FIG. 5, according to one or more embodiments.
Figure 6B:
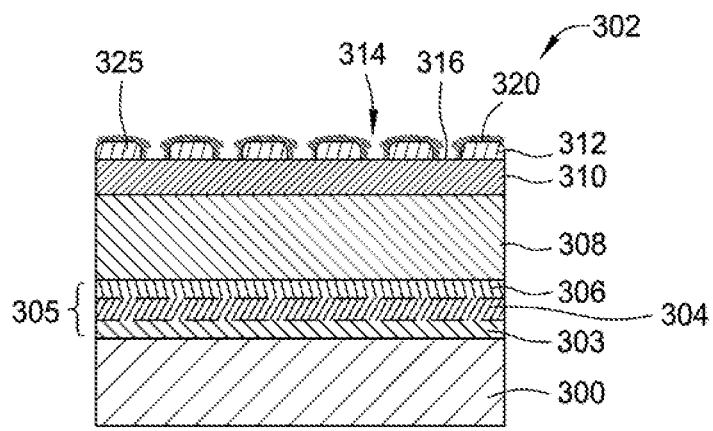

At operation 504, a deposition gas mixture is supplied to form a passivation layer 320 on the photoresist layer 312, as shown in FIG. 6B, prior to etching of the hardmask layer 310. The deposition gas mixture may be supplied in a PVD chamber, or in-situ in an etching chamber, so that the passivation layer 320 may be selectively formed on the photoresist layer 312 at a controlled manner predominately formed on the surface 325 of the photoresist layer 312. The deposition gas mixture may be supplied at a desired angle relative to the substrate surface so that the passivation layer 320 is predominately formed on the surface 325 of the photoresist layer 312, rather than sidewalls of the photoresist layer 312 or other exposed portion of the hardmask layer 310. By doing so, the dimensions of the openings 314 defined by the photoresist layer 312 is maintained unchanged so as to facilitate transfer features/openings to the hardmask layer 310 without dimension/geometry alternation.

In one or more embodiments, the deposition gas mixture includes a silicon containing gas, an oxygen-containing gas, a carbon containing gas, or the combinations thereof. In one or more examples, the deposition gas mixture includes $SiH_4$ and/or $CH_4$ gas.

Figure 6C:
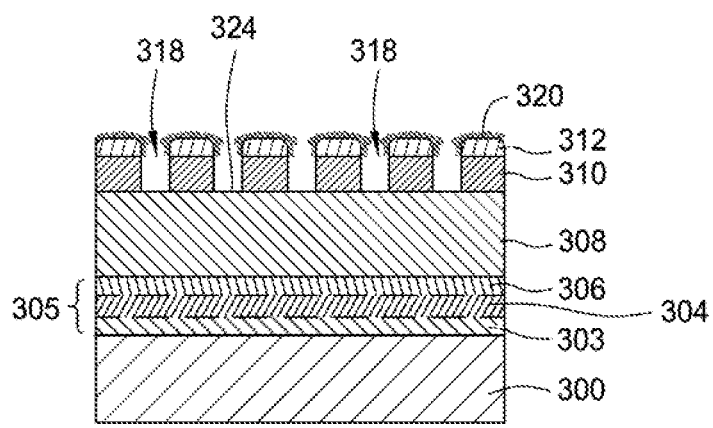

At operation 506, an etching process is then performed to etch the hardmask layer 310, as shown in FIG. 6C, until a surface 324 of the underlying BARC layer 308 is exposed. It is noted that the etching process may be continuously performed until the features/openings 318 are transferred further to the dielectric multi-layer 305 or target layer (not shown) as needed. During etching, a selected gas mixture is supplied into the processing chamber 100 to etch the hardmask layer 310 to form features 318 in the hardmask layer 310. The etching gas mixture selected to etch the hardmask layer 310 may be similar to or the same as the etching gas mixture described above at operation 204.

Figure 6D:
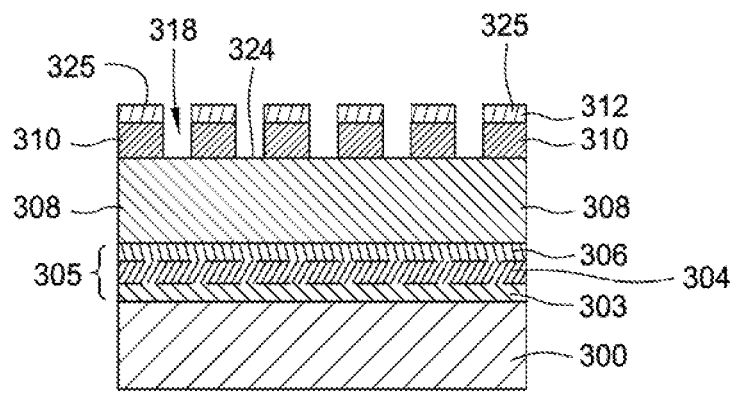

After the features/openings 318 are formed in the hardmask layer 310, a de-scum or a strip process may be performed to remove the remaining passivation layer 320, if any, from the substrate 300, as shown in FIG. 6D. It is noted that further etching process or patterning process may be performed to continue transferring features into the dielectric multi-layer 305 and/or the target layer (not shown) thereon as needed.

Thus, by utilizing a hardmask layer having a metal-containing material with desired absorption coefficient or mixture of different values of absorption coefficient, lithographic exposure accuracy, such as high resolution, low energy dose, good photoresist profile control and low line edge roughness may be enhanced.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for etching a hardmask layer, comprising:
   forming a hardmask layer on a substrate, wherein the hardmask layer comprises a metal-containing material comprising a metal element having an atomic number of greater than 28; wherein the hardmask layer is disposed on a bottom anti-reflective coating layer disposed on a dielectric multi-layer, and wherein the bottom anti-reflective coating layer is an amorphous carbon layer and the dielectric multi-layer comprises at least a silicon containing dielectric layer and a metal dielectric layer;
   supplying an etching gas mixture to the substrate, further comprising:
      supplying a deposition gas mixture to the substrate; and
      forming a passivation layer on a top surface of a photoresist layer disposed on the hardmask layer; and
   etching the hardmask layer exposed by the photoresist layer, wherein the etching further comprises pulsing an RF power while etching the hardmask layer.

2. The method of claim 1, wherein the metal-containing material further comprises silicon and oxygen, and wherein the metal-containing material comprises about 80 atomic percent (at %) to about 90 at % of the metal element.

3. The method of claim 1, further comprising an organic layer disposed between the bottom anti-reflective coating layer and the photoresist layer.

4. The method of claim 1, wherein the metal element is selected from the group consisting of tin, indium, gallium, zirconium, zinc, and any combination thereof.

5. The method of claim 1, wherein the metal-containing material comprises tin oxide, tin silicon oxide, indium tin oxide, indium gallium zinc oxide, an alloy thereof, or any combination thereof.

6. The method of claim 1, wherein the hardmask layer comprises multiple layers.

7. The method of claim 6, wherein an upper portion of the hardmask layer comprises has a greater concentration of the metal element than a lower portion of the hardmask layer.

8. The method of claim 6, wherein the hardmask layer comprises at least two layers having different absorption coefficients.

9. The method of claim 8, wherein the hardmask layer comprises a first layer comprising an element having the atomic number greater than 28 and a second layer comprising an element having an atomic number less than 28.

10. The method of claim 6, wherein the hardmask layer comprises a first layer comprising a first metal element, a second layer comprising a second metal element, and a third layer comprising a third metal element, and wherein the second metal element has an atomic number greater than or less than the first or third metal element.

11. The method of claim 1, wherein the hardmask layer is a gradient layer having different metal element concentration through the hardmask layer.

12. The method of claim 1, wherein the photoresist layer comprises at least one metal element selected from the group consisting of tin, indium, gallium, zirconium, zinc, and any combination thereof.

13. The method of claim 1, wherein forming the hardmask layer further comprises:
   forming a plasma comprising Xe or Kr while forming the hardmask layer.

14. The method of claim 1, wherein supplying the etching gas mixture further comprises supplying a chlorine-containing gas or a bromine-containing gas to etch the hardmask layer.

15. A method for etching a hardmask layer, comprising:
   forming a hardmask layer on a substrate, wherein the hardmask layer comprises a metal-containing material comprising a metal element having an atomic number of greater than 28; wherein the metal-containing material further comprises silicon and oxygen, and wherein the metal-containing material comprises about 80 atomic percent (at %) to about 90 at % of the metal element; wherein the hardmask layer is disposed on a bottom anti-reflective coating layer disposed on a dielectric multi-layer, and wherein the bottom anti-reflective coating layer is an amorphous carbon layer and the dielectric multi-layer comprises at least a silicon containing dielectric layer and a metal dielectric layer;
   forming a passivation layer on a surface of a photoresist layer disposed on the hardmask layer, wherein the hardmask layer comprises tin oxide, tin silicon oxide, indium tin oxide, indium gallium zinc oxide, an alloy thereof, or any combination thereof; and
   supplying an etching gas mixture to the substrate, further comprising:
      supplying a deposition gas mixture to the substrate; and
      forming a passivation layer on a top surface of a photoresist layer disposed on the hardmask layer; and
   etching the hardmask layer exposed by the photoresist layer, wherein the hardmask layer is etched by a gas mixture comprising a chlorine-containing gas or a bromine-containing gas.

16. The method of claim 15, wherein the hardmask layer comprises at least two layers having different absorption coefficients.

17. The method of claim 15, wherein an upper portion of the hardmask layer comprises has a greater concentration of the metal element than a lower portion of the hardmask layer.

18. The method of claim 15, further comprising an organic layer disposed between the bottom anti-reflective coating layer and the photoresist layer.

19. A method for etching a hardmask layer, comprising:
   forming a hardmask layer on a substrate, wherein the hardmask layer comprises a metal-containing material comprising a metal element having an atomic number of greater than 28; wherein the hardmask layer is disposed on a bottom anti-reflective coating layer disposed on a dielectric multi-layer, and wherein the bottom anti-reflective coating layer is an amorphous carbon layer and the dielectric multi-layer comprises at least a silicon containing dielectric layer and a metal dielectric layer;
   supplying an etching gas mixture to the substrate, further comprising:
      supplying a deposition gas mixture to the substrate; and
      forming a passivation layer on a top surface of a photoresist layer disposed on the hardmask layer; and
   etching the hardmask layer exposed by the photoresist layer, wherein the hardmask layer is etched by a gas mixture comprising a chlorine-containing gas or a bromine-containing gas, wherein the etching further comprises pulsing an RF power while etching the hardmask layer, and wherein the hardmask layer comprises at least two layers having different absorption coefficients.

20. The method of claim 19, further comprising an organic layer disposed between the bottom anti-reflective coating layer and the photoresist layer.

* * * * *